United States Patent
Ku

(10) Patent No.: US 12,283,326 B2
(45) Date of Patent: Apr. 22, 2025

(54) MEMORY CELL AND ARRAY STRUCTURE OF NON-VOLATILE MEMORY AND ASSOCIATED CONTROL METHOD

(71) Applicant: eMemory Technology Inc., Hsin-Chu (TW)

(72) Inventor: Wei-Ming Ku, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 315 days.

(21) Appl. No.: 18/113,675

(22) Filed: Feb. 24, 2023

(65) Prior Publication Data

US 2023/0290414 A1 Sep. 14, 2023

Related U.S. Application Data

(60) Provisional application No. 63/318,805, filed on Mar. 11, 2022.

(51) Int. Cl.
 *G11C 16/04* (2006.01)
 *G11C 16/14* (2006.01)
 *G11C 16/26* (2006.01)

(52) U.S. Cl.
 CPC .......... *G11C 16/14* (2013.01); *G11C 16/0408* (2013.01); *G11C 16/26* (2013.01)

(58) Field of Classification Search
 CPC ..... G11C 16/14; G11C 16/0408; G11C 16/26; G11C 11/5628; G11C 11/5642; G11C 11/5635; G11C 16/16; G11C 16/08; G11C 16/10; G11C 16/30; G11C 16/0433
 See application file for complete search history.

(56) References Cited

U.S. PATENT DOCUMENTS

| | | | |
|---|---|---|---|
| 6,295,226 B1 | 9/2001 | Yang | |
| 8,705,289 B2 | 4/2014 | Yang | |
| 8,941,167 B2 | 1/2015 | Chen | |
| 9,153,327 B2 * | 10/2015 | Ching | G11C 16/0441 |
| 11,250,921 B1 | 2/2022 | Chen et al. | |
| 2005/0018489 A1 | 1/2005 | Hosono | |
| 2006/0083098 A1 * | 4/2006 | Ho | G11C 7/12 |
| | | | 365/230.05 |
| 2009/0290417 A1 * | 11/2009 | Park | H10B 41/30 |
| | | | 257/315 |

(Continued)

OTHER PUBLICATIONS

Search report issued by EPO on Jul. 7, 2023.

*Primary Examiner* — Khamdan N. Alrobaie
(74) *Attorney, Agent, or Firm* — WPAT, PC

(57) ABSTRACT

A memory cell of a non-volatile memory includes a select transistor, a floating gate transistor, a first capacitor, a switching transistor and a second capacitor. A first drain/source terminal of the select transistor is connected with a source line. A gate terminal of the select transistor is connected with a word line. The two drain/source terminals of the floating gate transistor are respectively connected with a second drain/source terminal of the select transistor and a bit line. The first capacitor is connected between a floating gate of the floating gate transistor and an erase node. The two drain/source terminals of the switching transistor are respectively connected with the erase node and an erase line. The gate terminal of the switching transistor is connected with a control line. The second capacitor is connected between the erase node and a boost line.

19 Claims, 11 Drawing Sheets

(56) References Cited

U.S. PATENT DOCUMENTS

| | | | |
|---|---|---|---|
| 2013/0234228 A1 | 9/2013 | Hsu et al. | |
| 2017/0301682 A1* | 10/2017 | Li | G11C 17/16 |
| 2020/0006508 A1* | 1/2020 | Lo | H10D 30/6892 |
| 2020/0160924 A1* | 5/2020 | Chien | G05F 3/22 |
| 2023/0014498 A1* | 1/2023 | Kuo | H10B 41/30 |

* cited by examiner

MEMORY CELL AND ARRAY STRUCTURE OF NON-VOLATILE MEMORY AND ASSOCIATED CONTROL METHOD

This application claims the benefit of U.S. provisional application Ser. No. 63/318,805, filed Mar. 11, 2022, the subject matter of which is incorporated herein by reference.

FIELD OF THE INVENTION

The present invention relates to a non-volatile memory, and more particularly to a memory cell and an array structure of a non-volatile memory and associated control method.

BACKGROUND OF THE INVENTION

Non-volatile memories have been widely used in a variety of electronic products. After the supplied power is interrupted, the data stored in the non-volatile memory is still retained. The non-volatile memory comprises an array structure with plural non-volatile memory cells. Each non-volatile memory cell comprises a floating gate transistor.

FIG. 1A is a schematic equivalent circuit diagram of a conventional single-poly non-volatile memory cell. For example, the erasable programmable single-poly non-volatile memory is disclosed in U.S. Pat. No. 8,941,167. For succinctness, the single-poly non-volatile memory cell is referred hereinafter as a memory cell.

As shown in FIG. 1A, the conventional memory cell comprises a select transistor $M_S$, a floating gate transistor $M_F$ and a metal-oxide-semiconductor capacitor $C_{MOS}$. The metal-oxide-semiconductor capacitor $C_{MOS}$ is also referred as a MOS capacitor. Since the memory cells comprises two transistors and one capacitor, the memory cell is referred as a 2T1C cell.

The select transistor $M_S$ and the floating gate transistor $M_F$ are constructed in an N-well region. The select transistor $M_S$ and the floating gate transistor $M_F$ are p-type transistors. The MOS capacitor $C_{MOS}$ is an n-type transistor. The n-type transistor is formed in a P-well region. The two drain/source terminals are connected with each other. Consequently, the n-type transistor is formed as the MOS capacitor $C_{MOS}$. The N-well region receives an N-well voltage $V_{NW}$. The P-well region receives a P-well voltage $V_{PW}$. That is, the body terminal of the select transistor $M_S$ and the body terminal of the floating gate transistor $M_F$ receives the N-well voltage $V_{NW1}$, and the body terminal of the n-type transistor receives the P-well voltage $V_{PW}$.

Please refer to FIG. 1A again. The first drain/source terminal of the select transistor $M_S$ is connected with a source line to receive a source line voltage $V_{SL}$. The gate terminal of the select transistor $M_S$ is connected with a select gate line to receive a select gate voltage $V_{SG}$. The first drain/source terminal of the floating gate transistor $M_F$ is connected with the second drain/source terminal of the select transistor $M_S$. The second drain/source terminal of the floating gate transistor $M_F$ is connected with a bit line to receive a bit line voltage $V_{BL}$. The first terminal of the MOS capacitor $C_{MOS}$ is connected with a floating gate 36 of the floating gate transistor $M_F$. The second terminal of the MOS capacitor $C_{MOS}$ is connected with an erase line to receive an erase line voltage $V_{EL}$.

By providing proper bias voltages as the select gate voltage $V_{SG}$, the source line voltage $V_{SL}$, the bit line voltage $V_{BL}$, the erase line voltage $V_{EL}$, the N-well voltage $V_{NW}$ and the P-well voltage $V_{PW}$, a program action, an erase action or a read action can be selectively performed on the memory cell.

When the program action is performed, hot carriers (e.g., electrons) are selectively injected into the floating gate of the floating gate transistor $M_F$ or not. For example, if hot carriers (e.g., electrons) are not injected into the floating gate of the floating gate transistor $M_F$, the memory cell is programmed to a first storage state. Whereas, if hot carriers (e.g., electrons) are injected into the floating gate of the floating gate transistor $M_F$, the memory cell is programmed to a second storage state.

When the erase action is performed, the hot carriers stored in the floating gate of the floating gate transistor $M_F$ are ejected to the erase line EL through the MOS capacitor $C_{MOS}$. Consequently, the memory cell is in the first storage state.

When the read action is performed, the storage state of the memory cell is determined to be the first storage state or the second storage state according to the magnitude of a read current generated by the memory cell.

When the program action is performed, the source line voltage $V_{SL}$ is a program voltage $V_{PP}$ (e.g., about 7.5V). When the erase action is performed, the erase line voltage $V_{EL}$ is an erase voltage $V_{EE}$ (e.g., 15V). When the read action is performed, the source line voltage $V_{SA}$ is a read voltage $V_{PP}$ (e.g., about 2.0V). In other words, the erase voltage $V_{EE}$ is the largest among the above bias voltages.

FIG. 1B is a schematic circuit diagram illustrating the architecture of a conventional non-volatile memory. The non-volatile memory comprises an array structure, a word line driver 110, a bit line driver 120 and an erase line driver 130.

As shown in FIG. 1B, the array structure comprises plural memory cells $c_{11} \sim c_{MN}$, which are arranged in an M×N array, wherein M and N are positive integers. The array structure also comprises a source line SL, M word lines $WL_1 \sim WL_M$, M erase lines $EL_1 \sim EL_M$ and N bit lines $BL_1 \sim BL_N$. The structure and internal relationship of each of the memory cells $c_{11} \sim c_{MN}$ are similar to those of the memory cell as shown in FIG. 1A, and not redundantly described herein. For succinctness, only the structure of the memory cell c11 will be described as follows. In the memory cell c11, the first drain/source terminal of the select transistor $M_S$ is connected with the source line SL, the gate terminal of the select transistor $M_S$ is connected with the word line WL1. The second drain/source terminal of the floating gate transistor $M_F$ is connected with the bit line BL1, and the second terminal of the capacitor $C_{MOS}$ is connected with the erase line EL1.

Please refer to the array structure of FIG. 1B again. The N memory cells $c_{11} \sim c_{1N}$ in the first row are all connected with the source line SL, the word line $WL_1$ and the erase line $EL_1$. Moreover, the memory cells $c_{11} \sim c_{1N}$ in the first row are connected with the corresponding N bit lines $BL_1 \sim BL_N$, respectively. Similarly, the N memory cells $c_{21} \sim c_{2N}$ in the second row are all connected with the source line SL, the word line $WL_2$ and the erase line $EL_2$. Moreover, the memory cells $c_{21} \sim c_{2N}$ in the second row are connected with the corresponding N bit lines $BL_1 \sim BL_N$, respectively. The rest may be deduced by analog. Similarly, the N memory cells $c_{M1} \sim c_{MN}$ in the M-th row are all connected with the source line SL, the word line $WL_M$ and the erase line ELM. Moreover, the memory cells $c_{M1} \sim c_{MN}$ in the M-th row are connected with the corresponding N bit lines $BL_1 \sim BL_N$, respectively.

The word line driver 110 is connected with the M word lines $WL_1$~$WL_4$ of the array structure. According to the select signal $S_1$, the word line driver 110 activates one of the M word lines $WL_1$-$WL_M$. For example, the word line driver 110 actives the word line $WL_1$ according to the select signal $S_1$.

Meanwhile, the word line driver 110 provides an on voltage $V_{ON}$ to the word line $WL_1$, and the word line driver 110 provides an off voltage $V_{OFF}$ to the other word line $WL_2$~$WL_M$. For example, the on voltage $V_{ON}$ is 0V, the off voltage $V_{OFF}$ is 7.5V. In other words, the word line driver 110 selects one row of the array structure as a selected row according to the select signal $S_1$.

The bit line driver 120 is connected with the N bit lines $BL_1$~$BL_N$ of the array structure. According to the select signal $S_2$, the bit line driver 120 activates one of the bit lines $BL_1$-$BL_N$ to determine a selected cell in the selected row.

The erase line driver 130 is connected with the M erase lines $EL_1$~$EL_M$ of the array structure. According to the select signal $S_3$, the erase line driver 130 provides various voltages to the M erase lines $EL_1$~$EL_M$ when the program action, the erase action or the read action is performed. For example, during the erase action, the erase line driver 130 actives the erase line $EL_1$ according to the select signal $S_3$. Meanwhile, the erase line driver 130 provides an erase voltage $V_{EE}$ to the erase line $EL_1$, and the erase line driver 130 provides a ground voltage (0V) to the other erase lines $EL_2$~$EL_M$.

FIG. 1C schematically illustrates the bias voltages for performing the erase action on the conventional non-volatile memory. For example, when the erase action is performed on the memory cell $C_{11}$~$C_{1N}$ in the first row of the array structure, the word line driver 110 actives the word line $WL_1$ according to the select signal $S_1$, and the erase driver 130 actives the erase line $EL_1$ according to the select signal $S_3$. Consequently, the first row of the array structure is served as the selected row.

Meanwhile, the source line SL receives the ground voltage (0V). The word line driver 110 provides the on voltage $V_{ON}$ to the word line $WL_1$, and the word line driver 110 provides the off voltage $V_{OFF}$ to the other word lines $WL_2$~$WL_M$. The erase line driver 130 provides the erase voltage $V_{EE}$ to the erase line $EL_1$, and the erase line driver 130 provides the ground voltage (0V) to the other erase line $EL_2$~$EL_M$. Moreover, the bit line driver 120 provides the ground voltage (0V) to the N bit lines $BL_1$~$BL_N$.

Please refer to FIG. 1C again. In the array structure, the unselected erase lines $EL_2$~$EL_M$ receive the ground voltage (0V), and the unselected word lines $WL_2$~$WL_M$ receive the off voltage $V_{OFF}$. Consequently, the storage states of the memory cells $C_{21}$~$C_{MN}$ in the unselected rows are not changed.

The first row of the array structure is the selected row. In the memory cell $C_{11}$, the hot carriers (e.g., electrons) stored in the floating gate transistor are ejected to the erase line $EL_1$ from the floating gate through the capacitor $C_{MOS}$. Consequently, the memory cell $c_{11}$ is changed from the second storage state to the first storage state. Similarly, the memory cell $C_{1N}$ is changed from the second storage state to the first storage state. Moreover, since the memory cell $c_{12}$ is originally in the first storage state, it means that no hot carriers are stored in the floating gate transistor of the memory cell $c_{12}$. Consequently, the memory cell $c_{12}$ is maintained in the first storage state.

As mentioned above, after the erase action is completed, the storage state of each of the memory cells $c_{11}$~$c_{1N}$ in the selected row (i.e., the first row) is in the first storage state.

In the first storage state, no hot carriers are stored in the floating gate transistors of the corresponding memory cells.

When the erase action is performed on the non-volatile memory, the erase voltage $V_{EE}$ is transmitted from the erase line driver 130 to the erase line of the selected row according to the selected signal $S_3$. Generally, the erase line driver 130 comprises plural electronic components. In addition, plural switching paths are defined by the plural electronic components collaboratively. The switching paths of the erase line driver 130 are controlled according to the select signal $S_3$. Consequently, the erase voltage $V_{EE}$ can be transmitted to the erase line of the selected row. For example, as shown in FIG. 1C, the switching path 131 is turned on according to the select signal $S_3$ during the erase action. Consequently, the erase voltage $V_{EE}$ can be transmitted to the erase line $EL_1$ of the selected row through the switching path 131.

During the erase action, the erase voltage $V_{EE}$ is transmitted through the switching path 131 of the erase line driver 130. Consequently, the electronic components connected with the switching path 131 and the erase line $EL_1$ may be subjected to the highest voltage stress. For example, if the erase voltage $V_{EE}$ is 15V, the electronic components connected with the switching path 131 and the erase line $EL_1$ are possibly subjected to the voltage stress of 15V. If any of the electronic components connected with the switching path 131 and the erase line $EL_1$ is damaged by the voltage stress, the non-volatile memory cannot be operated normally.

SUMMARY OF THE INVENTION

An embodiment of the present invention provides an array structure of a non-volatile memory. The array structure includes a first memory cell. The first memory cell includes a first select transistor, a first floating gate transistor, a first capacitor, a first switching transistor and a second capacitor. A first drain/source terminal of the first select transistor is connected with a source line. A gate terminal of the first select transistor is connected with a first word line. A first drain/source terminal of the first floating gate transistor is connected with a second drain/source terminal of the first select transistor. A second drain/source terminal of the first floating gate transistor is connected with a first bit line. A first terminal of the first capacitor is connected with a floating gate of the first floating gate transistor. A second terminal of the first capacitor is connected with a first erase node. A first drain/source terminal of the first switching transistor is connected with the first erase node. A second drain/source terminal of the first switching transistor is connected with a first erase line. A gate terminal of the first switching transistor is connected with a control line. A first terminal of the second capacitor is connected with the first erase node. A second terminal of the second capacitor is connected with a first boost line.

An embodiment of the present invention provides a control method applied to a memory cell of a non-volatile memory. The memory cell comprises: a select transistor including a first drain/source terminal connected with a source line, and a gate terminal connected with a word line; a floating gate transistor including a first drain/source terminal connected with a second drain/source terminal of the select transistor, and a second drain/source terminal connected with a bit line; and a first capacitor including a first terminal connected with a floating gate of the floating gate transistor, and a second terminal connected with a first erase node. The control method comprises steps of: during a program action, providing an on voltage to the word line, providing a program voltage between the source line and the bit line, and transmitting the program voltage to the erase node; during a pre-charge phase of an erase action, providing the on voltage to the word line, providing a ground voltage to the source line and the bit line, and transmitting a pre-charge voltage to the erase node; and, during an erase phase of the erase action after the pre-charge phase, providing the on voltage to the word line, providing the ground voltage to the source line and the bit line, and boosting a voltage of the erase node from the pre-charge voltage to an erase voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a memory cell and an array structure of a non-volatile memory and associated control method. The memory cell has a novel architecture. When an erase action is operated on the memory cell, it is not necessary for an erase line driver to provide an erase voltage to the memory cell. Even if the erase voltage is not provided to the memory cell, the hot carriers (e.g., electrons) can be ejected from the memory cell.

Figure 1A:
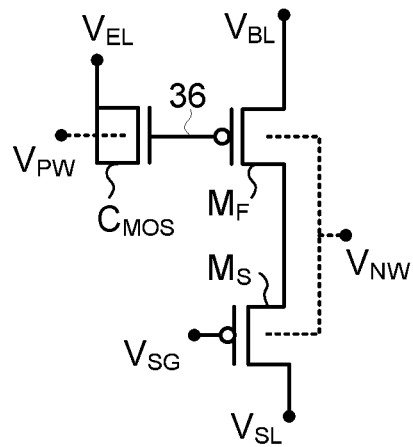
FIG. 1A (prior art) is a schematic equivalent circuit diagram of a conventional single-poly non-volatile memory cell.
Figure 1B:
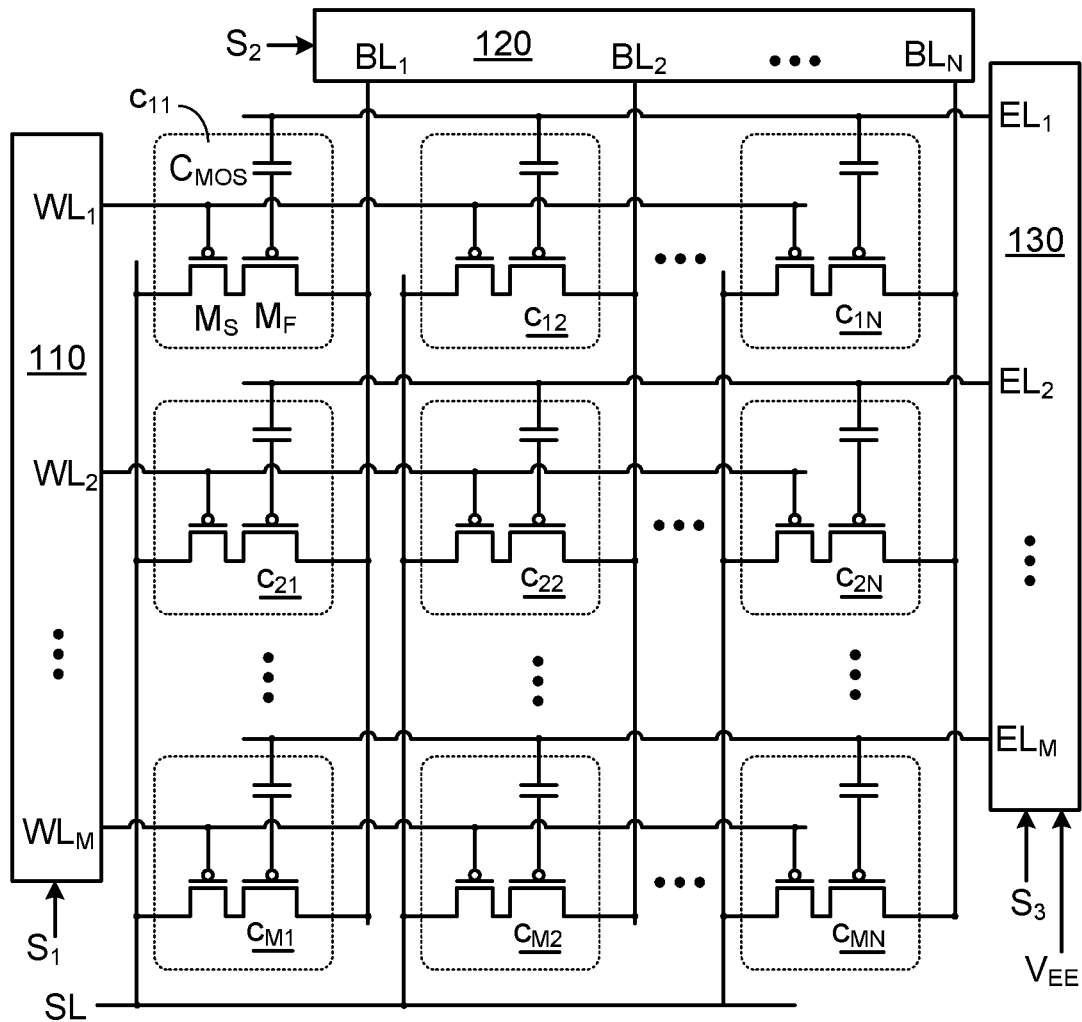
FIG. 1B (prior art) is a schematic circuit diagram illustrating the architecture of a conventional non-volatile memory.
Figure 1C:
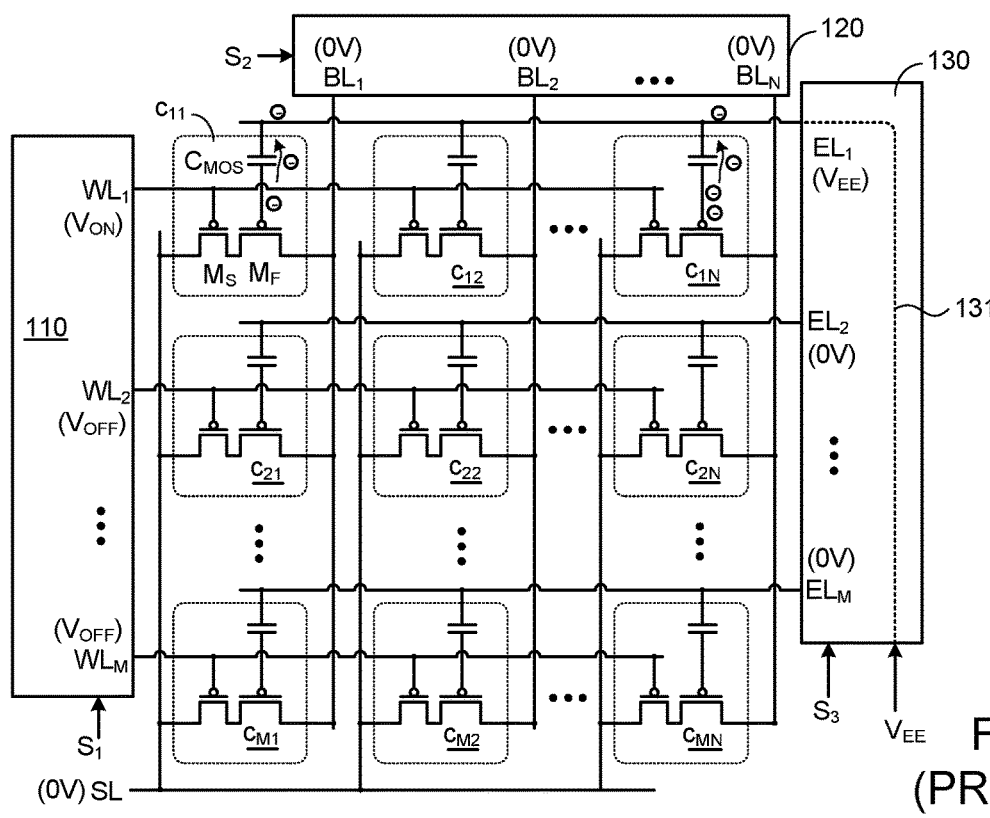
FIG. 1C (prior art) schematically illustrates the bias voltages for performing the erase action on the conventional non-volatile memory.
Figure 2:
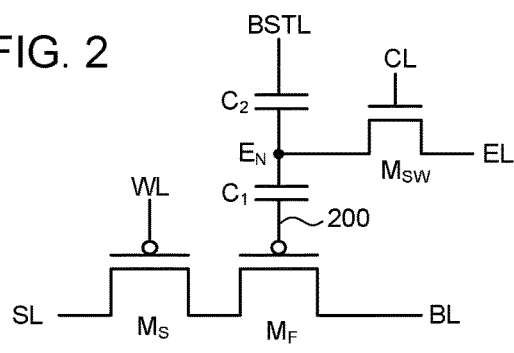
FIG. 2 is a schematic equivalent circuit diagram illustrating a non-volatile memory cell of a non-volatile memory according to an embodiment of the present invention.

FIG. 2 is a schematic equivalent circuit diagram illustrating a non-volatile memory cell of a non-volatile memory according to an embodiment of the present invention. The non-volatile memory cell is also referred to as a memory cell. As shown in FIG. 2, the memory cell further comprises a select transistor $M_S$, a floating gate transistor $M_F$, a switching transistor $M_{SW}$, a capacitor $C_1$ and a capacitor $C_2$. That is, the memory cell can be referred as a 3T2C memory cell.

The first drain/source terminal of the select transistor $M_S$ is connected with a source line SL. The gate terminal of the select transistor $M_S$ is connected with a word line WL. The first drain/source terminal of the floating gate transistor $M_F$ is connected with the second drain/source terminal of the select transistor $M_S$. The second drain/source terminal of the floating gate transistor $M_F$ is connected with a bit line BL. The first terminal of the capacitor $C_1$ is connected with a floating gate 200 of the floating gate transistor $M_F$. The second terminal of the capacitor $C_1$ is connected with an erase node $E_N$. The first terminal of the capacitor $C_2$ is connected with the erase node $E_N$. The second terminal of the capacitor $C_2$ is connected with a boost line BSTL. The first drain/source terminal of the switching transistor $M_{SW}$ is connected with the erase node $E_N$. The second drain/source terminal of the switching transistor $M_S$ is connected with an erase line EL. The gate terminal of the switching transistor $M_{SW}$ is connected with a control line CL.

In an embodiment, the select transistor $M_S$ and the floating gate transistor $M_F$ are p-type transistors, and the switching transistor $M_{SW}$ is an n-type transistor. Moreover, the capacitors $C_1$ and $C_2$ are MOS capacitors. It is noted that the types of these transistors are not restricted. For example, in another embodiment, the select transistor $M_S$ and the floating gate transistor $M_F$ are n-type transistors, and the switching transistor $M_{SW}$ is a p-type transistor. Alternatively, the select transistor $M_S$, the floating gate transistor $M_F$ and the switching transistor $M_{SW}$ are all p-type transistors, or the select transistor $M_S$, the floating gate transistor $M_F$ and the switching transistor $M_{SW}$ are all n-type transistors. Similarly, the types of the capacitors are not restricted. For example, in another embodiment, the capacitors $C_1$ and $C_2$ are plate capacitors).

By providing proper bias voltages to the source line SL, the word line WL, the bit line BL, the boost line BSTL, the erase line EL and the control line CL, a program action, a program inhibition action, an erase action or a read action can be selectively performed on the memory cell. The operations of the memory cell will be described in more details as follows.

When the program action is performed, hot carriers are injected into the floating gate 200 of the floating gate transistor MF. When the program inhibition action is performed, hot carriers are not injected into the floating gate 200 of the floating gate transistor MF. For example, if hot carriers are not injected into the floating gate 200 of the floating gate transistor MF, the memory cell is maintained in a first storage state. Whereas, if hot carriers are injected into the floating gate 200 of the floating gate transistor MF, the memory cell is programmed to a second storage state.

Figure 3A:
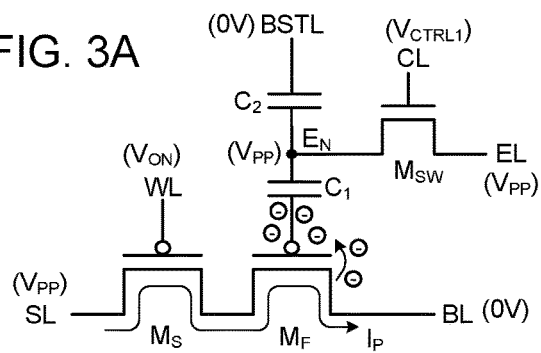
FIG. 3A is a schematic circuit diagram illustrating the bias voltages for controlling the memory cell to be in a second storage state according to the embodiment of the present invention.

FIG. 3A is a schematic circuit diagram illustrating the bias voltages for controlling the memory cell to be in a second storage state according to the embodiment of the present invention. During the program action, the source line SL receives a program voltage $V_{PP}$, the bit line BL receives a ground voltage (0V), the boost line BSTL receives the ground voltage (0V), the erases line EL receives the program voltage $V_{PP}$, the word line WL receives an on voltage $V_{ON}$, and the control line CL receives a control voltage $V_{CTRL1}$. For example, the program voltage $V_{PP}$ is 7.5V, and the on voltage $V_{ON}$ is equal to the ground voltage (0V). Moreover, the control voltage $V_{CTRL1}$ is 7.5V.

Please refer to FIG. 3A again. The control line CL receives the control voltage $V_{CTRL}1$. Consequently, the switching transistor $M_{SW}$ is turned on, and the program voltage $V_{PP}$ is transmitted to the erase node $E_N$. Moreover, the word line WL receives the on voltage $V_{ON}$. Consequently, the select transistor $M_S$ is turned on, and a program current $I_P$ generated by the memory cell flows from the source line SL to the bit line BL. When the program current $I_P$ flows through the channel region of the floating gate transistor $M_F$, hot carriers (e.g., electrons) are injected into the floating gate 200 of the floating gate transistor $M_F$ from the channel region of the floating gate transistor $M_F$. Consequently, the storage state of the memory cell is changed from the first storage state to the second storage state.

Figure 3B:
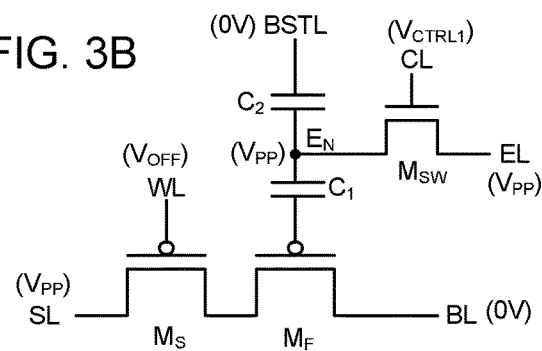
FIG. 3B is a schematic circuit diagram illustrating the bias voltages for controlling the memory cell to be in a first storage state according to the embodiment of the present invention.

FIG. 3B is a schematic circuit diagram illustrating the bias voltages for controlling the memory cell to be in the first storage state according to the embodiment of the present invention. During the program inhibition action, the source line SL receives the program voltage $V_{PP}$, the bit line BL receives the ground voltage (0V), the boost line BSTL receives the ground voltage (0V), the erase line EL receives the program voltage $V_{PP}$, the word line WL receives an off voltage $V_{OFF}$, and control line CL receives the control voltage $V_{CTRL1}$ For example, the off voltage $V_{OFF}$ is 7.5V.

Since the word line WL receives the off voltage VOFF, the select transistor MS is turned off. Consequently, the memory cell does not generate the program current IP. Under this circumstance, no hot carriers are injected into the floating gate 200 of the floating gate transistor MF. Consequently, the memory cell is maintained in the first storage state.

In some other embodiments, the bias voltages to be provided to the memory cell may be varied such that the memory cell does not generate the program current $I_P$. In other words, the memory cell is maintained in the first storage state. For example, during the program inhibition action, the source line SL receives the program voltage $V_{PP}$, the bit line BL receives the program voltage $V_{PP}$, the boost line BSTL receives the ground voltage (0V), the erase line EL receives the program voltage $V_{PP}$, the word line WL receives the on voltage $V_{ON}$, and the control line CL receives the control voltage $V_{CTRL1}$. That is, both of the source line SL and the bit line BL receive the program voltage $V_{PP}$. Consequently, regardless of whether the word line WL receives the on voltage $V_{ON}$ or the off voltage $V_{OFF}$, the memory cell does not generate the program current $I_P$.

Figure 3C:
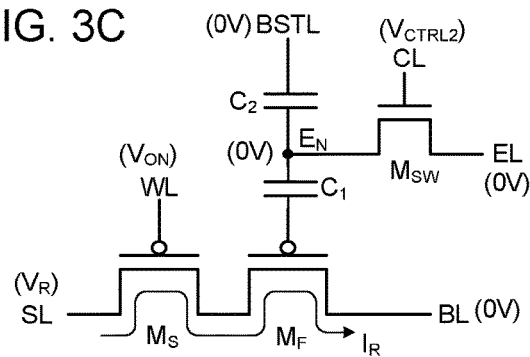
FIG. 3C is a schematic circuit diagram illustrating the bias voltages for performing a read action on the memory cell according to the embodiment of the present invention.

FIG. 3C is a schematic circuit diagram illustrating the bias voltages for performing a read action on the memory cell according to the embodiment of the present invention. During the read action, the storage state of the memory cell is determined according to the result of judging whether hot carriers are stored in the floating gate transistor $M_F$. During the read action, a voltage difference is provided between the source line SL and bit line BL. The voltage difference is a read voltage $V_R$.

As shown in FIG. 3C, the source line SL receives the read voltage $V_R$, the bit line BL receives the ground voltage (0V) or a low voltage (e.g. 0.4V) lower than the read voltage $V_R$, the boost line BSTL receives the ground voltage (0V), the erase line EL receives the ground voltage (0V), the word line WL receives the on voltage $V_{ON}$, and the control line CL receives a control voltage $V_{CTRL2}$ to turn on the switching transistor $M_{SW}$, such that the ground voltage is transmitted to the erase node $E_N$ and the erase node is not floating, such that the read action can be performed normally. For example, the control voltage $V_{CTRL2}$ is 3.3V, and the read voltage $V_R$ is 2.0V.

In another embodiment, during the read action, the source line may receive a first read voltage $V_{R1}$, the first bit line may receive a second read voltage $V_{R2}$ lower than the first read voltage $V_{R1}$, the first erase line receives a third read voltage $V_{R3}$. For example, a bias voltage ($V_{R1}$) of 2.4V is provided to the source line SL, a bias voltage ($V_{R2}$) of 0.4V is provided to the bit line BL, and a bias voltage ($V_{R3}$) of 0V is provided to the erase line EL. Consequently, the voltage difference between the source line SL and the bit line BL is equal to the read voltage $V_R$ (i.e., 2.0V).

Please refer to FIG. 3C again. Since the word line WL receives the on voltage $V_{ON}$, the select transistor $M_S$ is turned on, and a read current $I_R$ generated by the memory cell flows from the source line SL to the bit line BL. Moreover, according to the magnitude of the read current $I_R$, the storage state of the memory cell is determined. For example, in case that hot carriers are stored in the floating gate transistor $M_F$, the magnitude of the read current $I_R$ of the memory cell is higher. Whereas, in case that no hot carriers are stored in the floating gate transistor $M_F$, the magnitude of the read current $I_R$ of the memory cell is very low (or nearly zero). Moreover, a sensing circuit (not shown) is provided to judge the storage state of the memory cell according to the magnitude of the read current $I_R$ and a reference current $I_{REF}$.

For example, the sensing circuit (not shown) receives the reference current $I_{REF}$ and the read current $I_R$. If the magnitude of the read current $I_R$ is lower than the magnitude of the reference current $I_{REF}$, the sensing circuit judges that the memory cell is in the first storage state. Whereas, if the magnitude of the read current $I_R$ is higher than the reference current $I_{REF}$, the sensing circuit judges that the memory cell is in the second storage state.

In the above embodiment of the present invention, the memory cell further comprises the switching transistor $M_{SW}$ and the capacitor C2 in comparison with the conventional memory cell. The switching transistor $M_{SW}$ is connected between the erase node $E_N$ and the erase line EL. The capacitor $C_2$ is connected between the erase node $E_N$ and the boost line BSTL. Consequently, during the erase action, the memory cell can withstand a lower voltage stress. The operations of the memory cell during the erase action will be described in more details as follows.

Figure 4A:
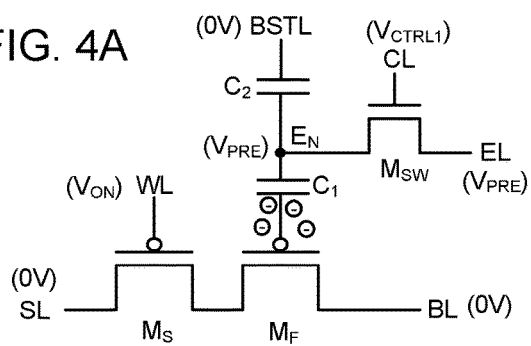
FIG. 4A is a schematic circuit diagram illustrating the bias voltages for performing an erase action on the memory cell in a pre-charge phase of an erase cycle.
Figure 4B:
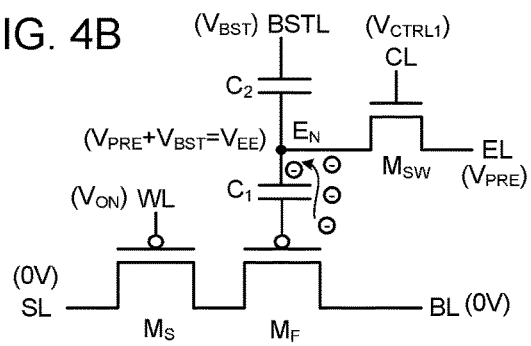
FIG. 4B is a schematic circuit diagram illustrating the bias voltages for performing the erase action on the memory cell in an erase phase of the erase cycle.
Figure 4C:
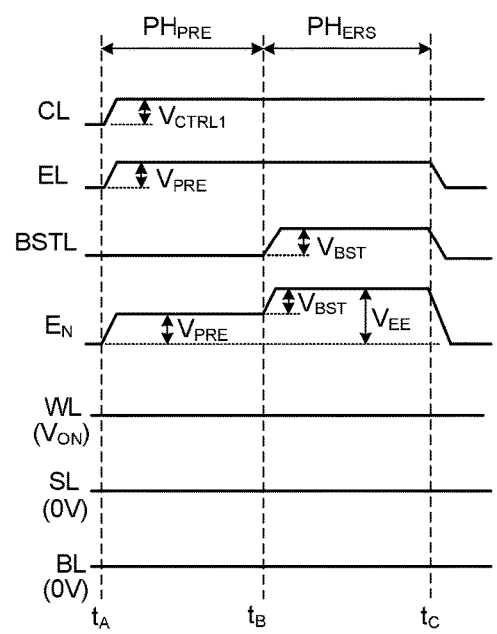
FIG. 4C is a schematic timing waveform diagram illustrating associated signals of the memory cell when the erase action is performed.

FIG. 4A is a schematic circuit diagram illustrating the bias voltages for performing an erase action on the memory cell in a pre-charge phase of an erase cycle. FIG. 4B is a schematic circuit diagram illustrating the bias voltages for performing the erase action on the memory cell in an erase phase of the erase cycle. FIG. 4C is a schematic timing waveform diagram illustrating associated signals of the memory cell when the erase action is performed. The erase cycle contains a pre-charge phase $PH_{PRE}$ and an erase phase $PH_{ERS}$. It is assumed that the memory cell is in the second storage state before the erase action is performed. That is, hot carriers (e.g., electrons) are stored in the floating gate of the floating gate transistor MF.

Please refer to FIGS. 4A and 4C. The time interval between the time point to and the time point $t_B$ is the pre-charge phase $PH_{PRE}$ of the erase cycle. In the pre-charge phase $PH_{PRE}$, the source line SL receives the ground voltage (0V), the bit line BL receives the ground voltage (0V), the word line WL receives the on voltage $V_{ON}$, the boost line BSTL receives the ground voltage (0V), the erase line EL receives a pre-charge voltage $V_{PRE}$, and the control line CL receives the control voltage $V_{CTRL1}$. Moreover, the magnitude of the control voltage $V_{CTRL1}$ is equal to the magnitude of the pre-charge voltage $V_{PRE}$, and the magnitude of the pre-charge voltage $V_{PRE}$ is lower than the magnitude of the erase voltage $V_{EE}$. For example, each of the control voltage $V_{CTRL1}$ and the pre-charge voltage $V_{PRE}$ is 7.5V, and the erase voltage $V_{EE}$ is 15V.

Since the word line WL receives the on voltage $V_{ON}$, the select transistor $M_S$ is turned on. Consequently, the voltage at each of the first drain/source terminal and the second drain/source terminal of the floating gate transistor MF is the ground voltage (0V). Moreover, since the control line CL receives the control voltage $V_{CTRL1}$, the switching transistor $M_{SW}$ is turned on, and the pre-charge voltage $V_{PRE}$ is transmitted to the erase node $E_N$. Obviously, in the pre-charge phase $PH_{PRE}$, the voltage at the erase node $E_N$ is equal to the pre-charge voltage $V_{PRE}$, and the magnitude of the pre-charge $V_{PRE}$ is lower than the magnitude of the erase voltage $V_{EE}$. Consequently, the hot carriers are still stored in the floating gate of the floating gate transistor $M_F$, and the hot carriers are unable be ejected from the floating gate.

Please refer to FIGS. 4B and 4C. The time interval between the time point $t_B$ and the time point $t_C$ is the erase phase $PH_{ERS}$ of the erase cycle. In the erase phase $PH_{ERS}$, the source line SL receives the ground voltage (0V), the bit line BL receives the ground voltage (0V), the word line WL receives the on voltage $V_{ON}$, the boost line BSTL receives a boost voltage $V_{BST}$, the erase line EL receives the pre-charge voltage $V_{PRE}$, and the control line CL receives the control voltage $V_{CTRL1}$. The magnitude of the boost voltage $V_{BST}$ is lower than the magnitude of the erase voltage $V_{EE}$. However, the sum of the pre-charge voltage $V_{PRE}$ and the boost voltage $V_{BST}$ is higher than or equal to the magnitude of the erase voltage $V_{EE}$. For example, the boost voltage $V_{BST}$ is 7.5V.

At the time point $t_B$, the boost line BSTL is increased from the ground voltage (0V) to the boost voltage $V_{BST}$. Moreover, the boost voltage $V_{BST}$ is coupled to the erase node $E_N$ through the capacitor $C_2$. Consequently, the voltage at the erase node $E_N$ is increased by a voltage increment from the pre-charge voltage $V_{PRE}$. The voltage increment is approximately equal to the boost voltage $V_{BST}$. Consequently, the voltage at the erase node $E_N$ is approximately equal to the sum of the pre-charge voltage $V_{PRE}$ and the boost voltage $V_{BST}$ and equal to the erase voltage $V_{EE}$. That is, $V_{EE}=V_{PRE}+V_{BST}$. That is, in the erase phase $PH_{ERS}$, the voltage at the erase node $E_N$ is boosted to the erase voltage $V_{EE}$.

When the voltage at the erase node $E_N$ is boosted to the erase voltage $V_{EE}$, the voltage at the first drain/source terminal of the switching transistor $M_{SW}$ is equal to the erase voltage $V_{EE}$ (e.g., 15V), the voltage at the gate terminal of the switching transistor $M_{SW}$ is equal to the control voltage $V_{CTRL1}$ (e.g., 7.5V), and the voltage at the second drain/source terminal of the switching transistor $M_{SW}$ is equal to the pre-charge voltage $V_{PRE}$ (e.g., 7.5V). Consequently, the switching transistor $M_{SW}$ is turned off. Meanwhile, the erase node $E_N$ is in a floating state, and the voltage at the erase node $E_N$ is maintained at the erase voltage $V_{EE}$.

Moreover, since the voltage at the erase node $E_N$ is equal to the erase voltage $V_{EE}$, the hot carriers stored in the floating gate transistor $M_F$ are ejected from the floating gate to the erase node $E_N$. Consequently, the storage state of the memory cell is changed from the second storage state to the first storage state.

As mentioned above, the voltage at the erase node $E_N$ can reach the highest erase voltage $V_{EE}$ only in the erase phase $PH_{ERS}$ of the erase cycle. However, the other conductor lines (e.g., the erase line EL and the boost line BSTL) cannot receive the highest erase voltage $V_{EE}$. In other words, all of the electronic components connected with the erase line EL and the boost line BSTL will not be subjected to the highest voltage stress. Consequently, these electronic components will not be damaged easily.

Figure 5:
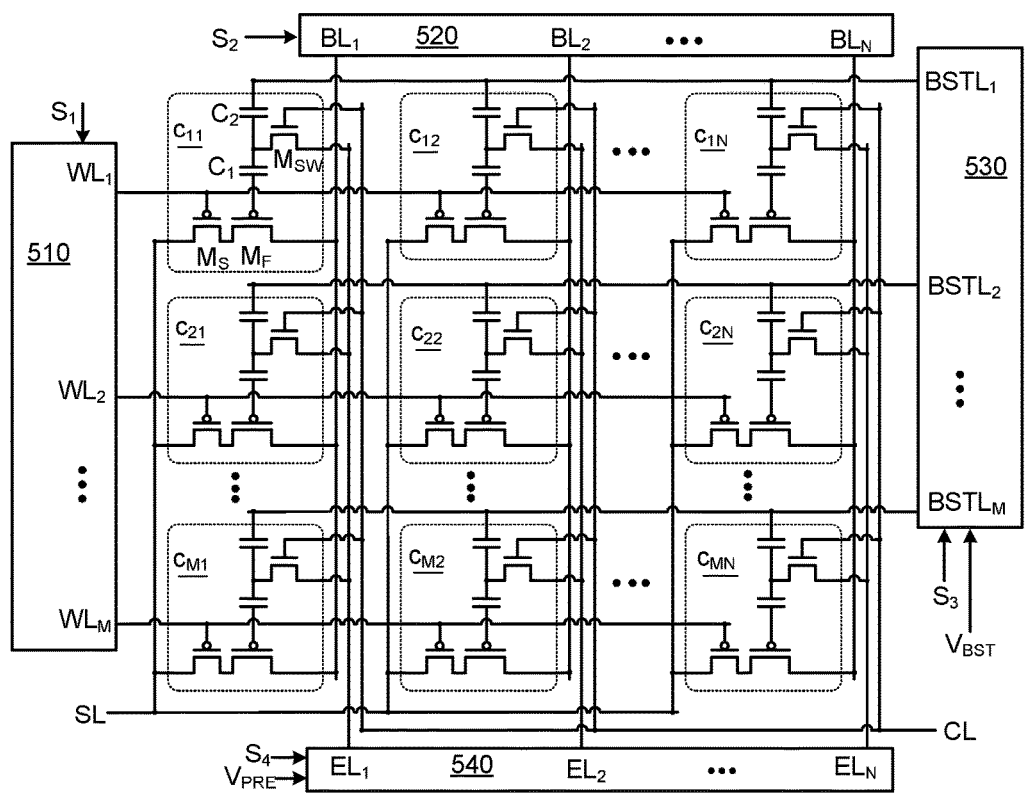
FIG. 5 is a schematic circuit diagram illustrating the architecture of the non-volatile memory according to an embodiment of the present invention.

FIG. 5 is a schematic circuit diagram illustrating the architecture of the non-volatile memory according to an embodiment of the present invention. The non-volatile memory comprises an array structure, a word line driver 510, a bit line driver 520, a boost line driver 530 and an erase line driver 540.

The array structure comprises plural memory cells $c_{11} \sim c_{MN}$, which are arranged in an M×N array, wherein M and N are positive integers. The array structure also comprises a source line SL, a control line CL, M word lines $WL_1 \sim WL_M$, M boost lines $BSTL_1 \sim BSTL_M$, N bit lines $BL_1 \sim BL_N$ and M erase lines $EL_1 \sim EL_M$. The structure and internal relationship of each of the memory cells $c_{11} \sim c_{MN}$ are similar to those of the memory cell as shown in FIG. 2, and not redundantly described herein. For succinctness, only the structure of the memory cell $c_{11}$ will be described as follows. In the memory cell $c_{11}$, the first drain/source terminal of the select transistor $M_S$ is connected with the source line SL. The gate terminal of the select transistor $M_S$ is connected with the word line $WL_1$. The second drain/source terminal of the floating gate transistor $M_F$ is connected with the bit line $BL_1$. The second terminal of the switching transistor $M_{SW}$ is connected with the erase line $EL_1$. The gate terminal of the switching transistor $M_{SW}$ is connected with the control line CL. The second terminal of the capacitor $C_2$ is connected with the boost line BSTL1.

In the array structure, the N memory cells $c_{11} \sim c_{1N}$ in the first row are all connected with the source line SL, the control line CL, the word line $WL_1$ and the boost line $BSTL_1$. Moreover, the memory cells $c_{11}$~$c_{1N}$ in the first row are connected with the corresponding N bit lines $BL_1$~$BL_N$ and the N erase lines $EL_1$~$EL_N$, respectively. Similarly, the N memory cells $c_{21}$~$c_{2N}$ in the second row are all connected with the source line SL, the control line CL, the word line $WL_2$ and the boost line $BSTL_2$. Moreover, the memory cells $c_{21}$~$c_{2N}$ in the second row are connected with the corresponding N bit lines $BL_1$~$BL_N$ and erase lines $EL_1$~$EL_N$, respectively. The rest may be deduced by analog. Similarly, the N memory cells $c_{M1}$~$c_{MN}$ in the M-th row are all connected with the source line SL, the control line CL, the word line $WL_M$ and the boost line $BSTL_M$. Moreover, the N memory cells $c_{M1}$~$c_{MN}$ in the M-th row are connected with the corresponding N bit lines $BL_1$~$BL_N$ and erase lines $EL_1$~$EL_N$, respectively.

The word line driver 510 is connected with the M word lines $WL_1$~$WL_M$ of the array structure. According to the select signal $S_1$, the word line driver 110 activates one of the M word lines $WL_1$~$WL_M$. For example, the word line driver 510 actives the word line $WL_1$ according to the select signal $S_1$. At this time, the word line driver 510 provides an on voltage $V_{ON}$ to the word line $WL_1$, and the word line driver 510 provides an off voltages $V_{OFF}$ to the other word lines $WL_2$~$WL_M$. For example, the on voltage $V_{ON}$ is 0V, and the off voltage $V_{OFF}$ is 7.5V. In other words, the word line driver 510 selects one row of the array structure as a selected row according to the select signal $S_1$.

The bit line driver 520 is connected with the N bit lines $BL_1$~$BL_N$ of the array structure. According to the select signal $S_2$, the bit line driver 520 activates one of the bit lines $BL_1$~$BL_N$ to determine a selected cell in the selected row.

The boost line driver 530 is connected with the M boost lines $BSTL_1$~$BSTL_M$ of the array structure. According to the select signal $S_3$, the boost line driver 530 provides various voltages to the M boost lines $BSTL_1$~$BSTL_M$ when the program action, the erase action or the read action is performed. For example, during the erase action, the boost line driver 530 actives the boost line $BSTL_1$ according to the select signal $S_3$. Meanwhile, the boost line driver 530 provides a boost voltage $V_{BST}$ to the boost line $BSTL_1$, and the boost line driver 530 provides the ground voltage (0V) to the other boost lines $BSTL_2$~$BSTL_M$.

The erase line driver 540 is connected with the N erase line $EL_1$~$EL_N$ of the array structure. According to the select signal $S_4$, the erase line driver 540 provides various voltages to the N erase lines $EL_1$~$EL_N$ when the program action, the erase action or the read action is performed. For example, during the erase action, the erase line driver 540 actives the erase line $EL_1$ according to the select signal $S_4$. Meanwhile, the erase line driver 540 provides a pre-charge voltage $V_{PPE}$ to the erase line $EL_1$, and the erase line driver 540 provides the ground voltage (0V) to the other erase lines $EL_2$~$EL_N$.

By providing proper bias voltages to the source line SL, the control line CL, the M word lines $WL_1$~$WL_M$, the N bit lines $BL_1$~$BL_N$, the M boost lines $BSTL_1$~$BSTL_M$ and the N erase line $EL_1$~$EL_N$, a program action, a program inhibition action, an erase action or a read action can be selectively performed on the memory cell. The operations of the non-volatile memory of the present invention will be described in more details by taking the memory cell $c_{11}$ as an example.

Figure 6:
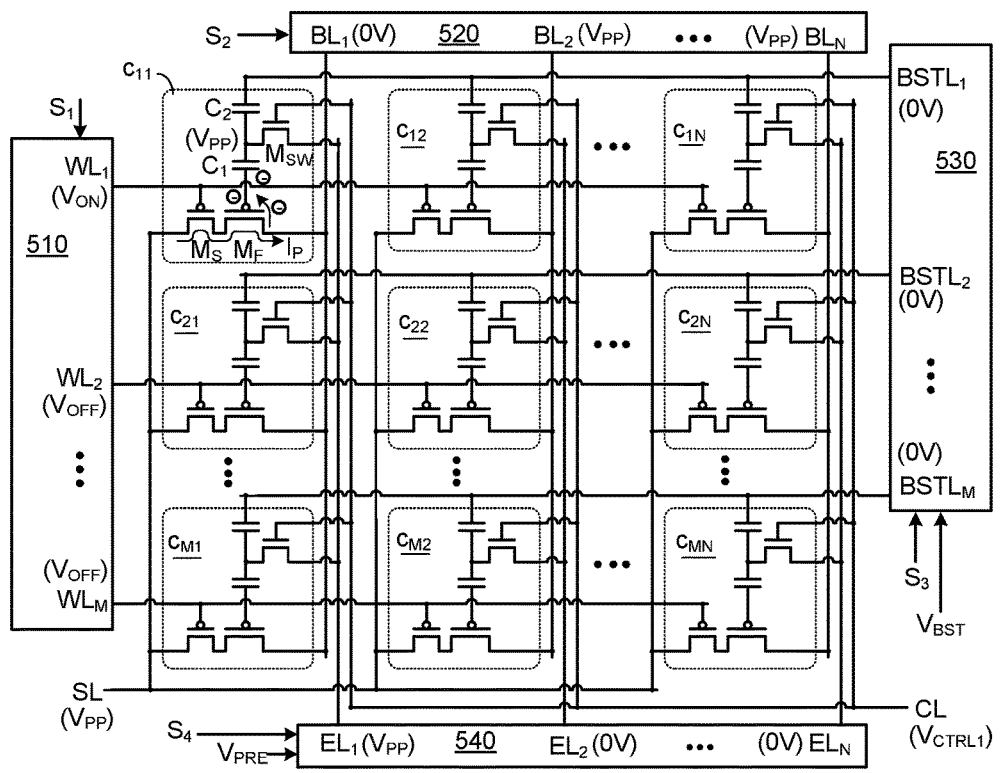
FIG. 6 schematically illustrates the bias voltages for performing the program action on the selected memory cell of the array structure according to the embodiment of the present invention.

FIG. 6 schematically illustrates the bias voltages for performing the program action on the selected memory cell of the array structure according to the embodiment of the present invention. During the program action, the source line SL receives a program voltage $V_{PP}$, the control line CL receives a control voltage $V_{CTRL1}$, the word line $WL_1$ receives an on voltage $V_{ON}$, the word lines $WL_1$~$WL_M$ receive an off voltage $V_{OFF}$, the bit line $BL_1$ receives the ground voltage (0V), the bit lines $BL_2$~$BL_N$ receive the program voltage $V_{PP}$, the boost lines $BSTL_1$~$BSTL_M$ receive the ground voltage (0V), the erase line $EL_1$ receives the program voltage $V_{PP}$, and the erase lines $EL_2$~$EL_N$ receive the ground voltage (0V). For example, the program voltage $V_{PP}$ is 7.5V, the on voltage $V_{ON}$ is equal to the ground voltage (0V), the off voltage $V_{OFF}$ is 7.5V, and the control voltage $VCTRL_1$ is 7.5V.

Moreover, since the word line WL1 and the bit line BL1 are activated, the first row is the selected row, and the other rows are the unselected rows. In the array structure, the memory cells $C_{21}$~$C_{MN}$ are unselected memory cells. In addition, the memory cell $c_{11}$ in the selected row is the selected memory cell, and the other memory cells $C_{12}$~$C_{1N}$ in the selected row are the unselected memory cells.

In the unselected memory cells $C_{12}$~$C_{1N}$ of the first row, the source line SL and the bit lines $BL_2$~$BL_N$ receive the program voltage $V_{PP}$. Consequently, the unselected memory cells $C_{12}$~$C_{1N}$ in the first row cannot generate the program current. That is, the unselected memory cells $C_{12}$~$C_{1N}$ are subjected to a program inhibition action, and their storage states are not changed. For example, the unselected memory cell $C_{12}$~$C_{1N}$ are maintained in the first storage state.

In the unselected memory cells $C_{21}$~$C_{MN}$ of the other rows, the word lines $WL_2$~$WL_M$ receive the off voltage $V_{OFF}$. Consequently, the unselected memory cells $C_{21}$~$C_{MN}$ of the other rows cannot generate the program current. That is, the unselected memory cells $C_{21}$~$C_{MN}$ are subjected to the program inhibition action, and their storage states are not changed. For example, the unselected memory cells $C_{21}$~$C_{MN}$ are maintained in the first storage state.

Please refer to FIG. 6 again. In the selected memory cell $C_{11}$ of the first row, the word line $WL_1$ receives the on voltage $V_{ON}$, the source line SL receives the program voltage $V_{PP}$, the bit line $BL_1$ receives the ground voltage (0V), the control line CL receives the control voltage $V_{CTRL1}$, the boost line $BSTL_1$ receives the ground voltage (0V), and the erase line $EL_1$ receives the program voltage $V_{PP}$. Consequently, the switching transistor $M_{SW}$ is turned on, and the program voltage $V_{PP}$ is transmitted to the erase node $E_N$. Moreover, the select transistor $M_S$ is turned on, and thus the memory cell generates a program current $I_P$. The program current $I_P$ flows from the source line SL to the bit line $BL_1$. When the program current $I_P$ flows through a channel region of the floating gate transistor $M_F$, hot carriers (e.g., electrons) are injected into the floating gate terminal from the channel region of the floating gate transistor $M_F$. Consequently, the storage state of the memory cell is changed from the first storage state to the second storage state.

Figure 7:
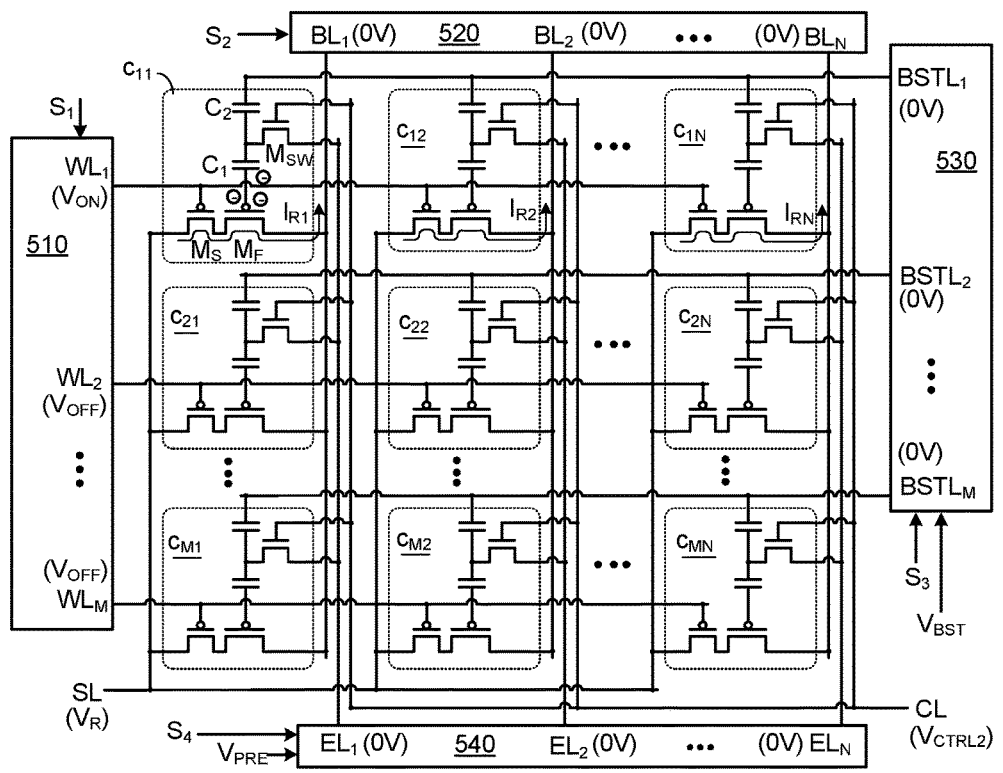
FIG. 7 schematically illustrates the bias voltages for performing the read action on the selected memory cell of the array structure according to the embodiment of the present invention.

FIG. 7 schematically illustrates the bias voltages for performing the read action on the selected memory cell of the array structure. During the read action, the source line SL receives a read voltage $V_R$, the control line CL receives a control voltage $V_{CTRL2}$, the word line $WL_1$ receives the on voltage $V_{ON}$, the word lines $WL_2$~$WL_M$ receive the off voltage $V_{OFF}$, the bit lines $BL_1$~$BL_N$ receive the ground voltage (0V), the boost lines $BSTL_1$~$BSTL_M$ receive the ground voltage (0V), and the erase lines $EL_1$~$EL_N$ receive the ground voltage (0V). For example, the read voltage $V_R$ is 2.0V, and the control voltage $V_{CTRL2}$ is 3.3V.

Moreover, since the word line $WL_1$ is activated, the first row is the selected row, and the other rows are the unselected rows. In addition, the memory cells $C_{21}$~$C_{MN}$ in the unselected row do not generate the read current.

Please refer to FIG. 7 again. In the selected row of the first row, the word line $WL_1$ receives the on voltage $V_{ON}$, the bit lines $BL_1$~$BL_N$ receive the ground voltage (0V), the source line SL receives the read voltage $V_R$, the control line CL receives the control voltage $V_{CTRL2}$, the boost line $BSTL_1$ receives the ground voltage (0V), and the erase lines $EL_1$~$EL_N$ receive the ground voltage (0V). Consequently, the memory $C_{11}$~$C_{1N}$ generate the read currents $I_{R1}$~$I_{RN}$, respectively. The read currents $I_{R1}$~$I_{RN}$ flow to the corresponding bit lines $BL_1$~$BL_N$, respectively.

Moreover, according to the magnitudes of the read current $I_{R1}$~$I_{RN}$, the storage states of the memory cell $C_{11}$~$C_{1N}$ are determined. For example, since hot carriers are stored in the memory cell $C_{11}$, the read current $I_{R1}$ generated by the memory cell $C_{11}$ is higher. A sensing circuit (not shown) judges that the memory cell $C_{11}$ is in the second storage state. Moreover, since no hot carriers are stored in the memory cell $C_{12}$, the read current $I_{R1}$ generated by the memory cell $C_{12}$ is lower (or nearly zero). The sensing circuit judges that the memory cell $C_{12}$ is in the first storage state.

Figure 8A:
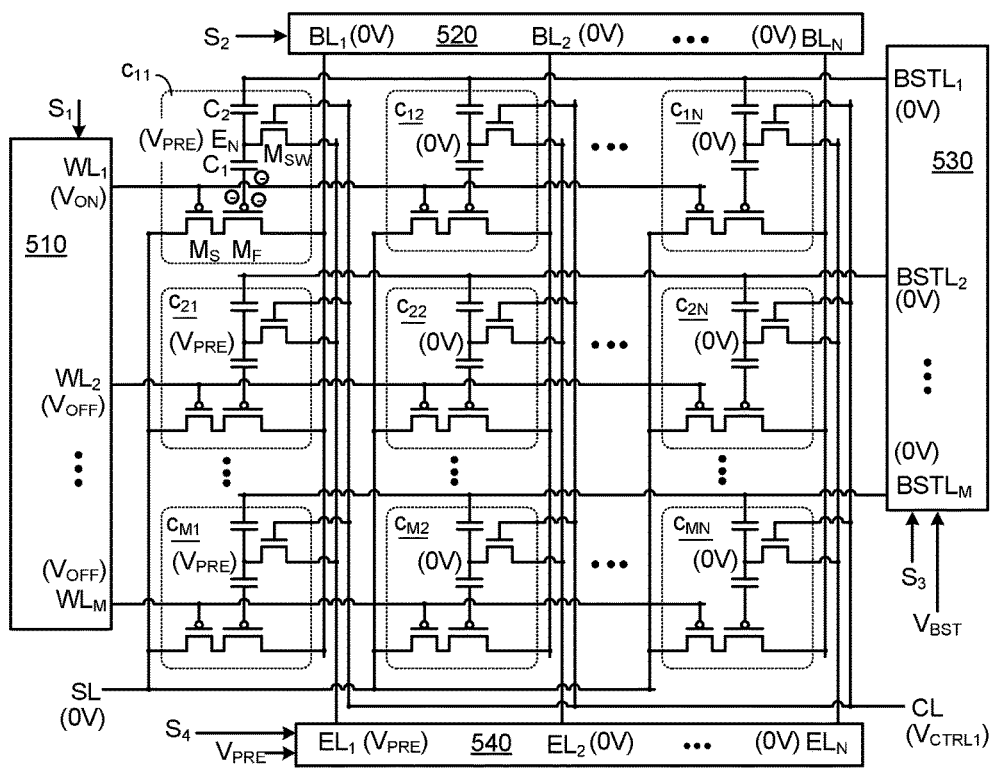
FIG. 8A schematically illustrates the bias voltages for performing the erase action on the selected memory cell of the array structure according to the embodiment of the present invention in the pre-charge phase of the erase cycle.
Figure 8B:
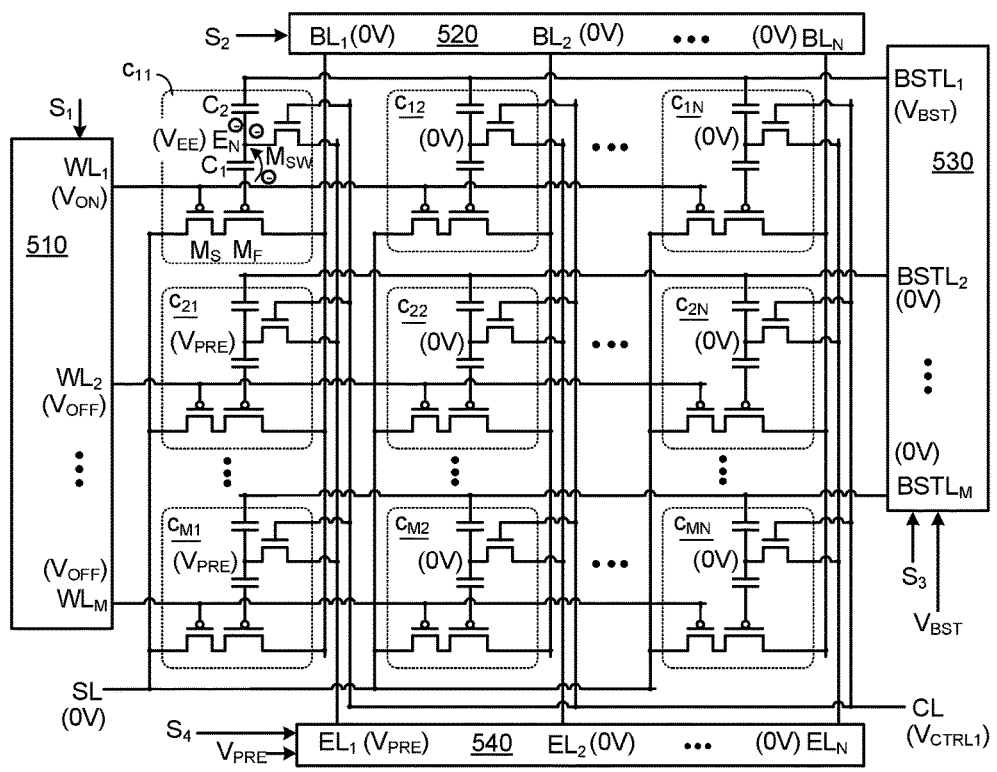
FIG. 8B schematically illustrates the bias voltages for performing the erase action on the selected memory cell of the array structure according to the embodiment of the present invention in the erase phase of the erase cycle.

FIG. 8A schematically illustrates the bias voltages for performing the erase action on the selected memory cell of the array structure according to the embodiment of the present invention in the pre-charge phase of the erase cycle. FIG. 8B schematically illustrates the bias voltages for performing the erase action on the selected memory cell of the array structure according to the embodiment of the present invention in the erase phase of the erase cycle.

Please refer to FIG. 8A. In the pre-charge phase of the erase cycle, the source line SL receives the ground voltage (0V), the bit lines $BL_1$~$BL_N$ receive the ground voltage (0V), the word line $WL_1$ receives the on voltage $V_{ON}$, the word lines $WL_2$~$WL_M$ receive the off voltage $V_{OFF}$, the control line CL receives the control voltage $V_{CTRL1}$, the boost lines $BSTL_1$~$BSTL_M$ receive the ground voltage (0V), the erase line $EL_1$ receives a pre-charge voltage $V_{PRE}$, and the erase lines $EL_2$~$EL_N$ receive the ground voltage (0V). For example, the pre-charge voltage $V_{PRE}$ is 7.5V.

Moreover, since the word line $WL_1$ and erase line $EL_1$ are activated, the first row is the selected row, and the other rows are the unselected rows. In the array structure, the memory cells $C_{21}$~$C_{MN}$ in the unselected rows are unselected memory cells. In addition, the memory cell $C_{11}$ in the selected row is the selected memory cell, and the other memory cells $C_{12}$~$C_{1N}$ in the selected row are the unselected memory cells.

Please refer to FIG. 8A again. In the memory cell $C_{11}$ of the first row, the erase line $EL_1$ receives the pre-charge voltage $V_{PRE}$. Consequently, the voltage at the erase line $E_N$ is equal to the pre-charge voltage $V_{PRE}$. In addition, in the memory cells $C_{12}$~$C_{1N}$ of the first row, the erase lines $EL_2$~$EL_N$ receive the ground voltage (0V). Consequently, the voltage at the corresponding erase node of the memory cells $C_{12}$~$C_{1N}$ is equal to the ground voltage (0V). Similarly, in the memory cell $C_{21}$ of the second row, the voltage at the erase node is equal to the pre-charge voltage $V_{PRE}$. In the memory cells $C_{22}$~$C_{2N}$ of the second row, the voltage of the corresponding erase node $E_N$ is equal to the ground voltage (0V). The rest may be deduced by analog. Similarly, in the memory cell $C_{M1}$ of the M-th row, the voltage at the erase node is equal to the pre-charge voltage $V_{PRE}$. In the memory cells $C_{M2}$~$C_{MN}$ of the M-th row, the voltage at the corresponding erase node $E_N$ is equal to the ground voltage (0V).

Please refer to FIG. 8B for bit erase operation. In the erase phase of the erase cycle, the source line SL receives the ground voltage (0V), the bit lines $BL_1$~$BL_N$ receive the ground voltage (0V), the word line $WL_1$ receives the on voltage $V_{ON}$, the word lines $WL_2$~$WL_M$ receive the off voltage $V_{OFF}$, the control line CL receives the control voltage $V_{CTRL1}$, the boost line $BSTL_1$ receives a boost voltage $V_{BST}$, the boost lines $BSTL_2$~$BSTL_M$ receive the ground voltage (0V), the erase line $EL_1$ receives the pre-charge voltage $V_{PRE}$, and the erase lines $EL_2$~$EL_N$ receive the ground voltage (0V). For example, the boost voltage $V_{BST}$ is 7.5V.

Please refer to FIG. 8B again. In the selected memory cell $C_{11}$ of the first row, since the boost line $BSTL_1$ receives the boost voltage $V_{BST}$. Consequently, the voltage at the erase node $E_N$ of the selected memory cell $C_{11}$ is boosted to the erase voltage $V_{EE}$. That is, $V_{EE}=V_{PRE}+V_{BST}$. Moreover, since the switching transistor $M_{SW}$ is turned off, the voltage at the erase node $E_N$ is maintained at the erase voltage $V_{EE}$. Consequently, the hot carriers are ejected from the floating gate of the floating gate transistor $M_F$ to the erase node $E_N$ through the capacitor $C_1$. Under this circumstance, the storage state of the selected memory cell $C_{11}$ is changed to the first storage state.

In the unselected memory cells $C_{12}$~$C_{1N}$ of the first row, the voltage at the erase node is boosted from the ground voltage (0V) to the boost voltage $V_{BST}$. Because the gates of the switching transistors $M_{SW}$ receive the control voltage $V_{CTRL1}$, the switching transistors $M_{SW}$ are still turned on and the voltages at the erase node $E_N$ nodes are further discharged from the boost voltage $V_{BST}$ to ground voltage (0V). Since the ground voltage (0V) is lower than the magnitude of the erase voltage $V_{EE}$, hot carriers in the unselected memory cells $C_{12}$~$C_{1N}$ are not ejected from the floating gates of the corresponding floating gate transistors. In other words, the unselected memory cells $C_{12}$~$C_{1N}$ are subjected the erase inhibition. Consequently, the storage states of the unselected memory cells $C_{12}$~$C_{1N}$ are not changed.

Moreover, the boost lines $BSTL_2$~$BSTL_M$ still receive the ground voltage (0V) for bit erase operation. Consequently, like the situation of FIG. 8A, the voltages at the erase nodes $E_N$ of the unselected memory cells $C_{21}$~$C_{MN}$ in the unselected rows (i.e., the second row to the M-th row) are not changed. In other words, the memory cells $C_{21}$~$C_{MN}$ of the unselected rows are subjected to the erase inhibition. Consequently, the storage states of the memory cells $C_{21}$~$C_{MN}$ are not changed.

As mentioned above, by providing proper bias voltages as the source line SL, the control line CL, the M word lines $WL_1$~$WL_M$, the N bit lines $BL_1$~$BL_N$, the M boost lines $BSTL_1$~$BSTL_M$ and the N erase line $EL_1$~$EL_N$, the program action, the program inhibition action, the erase action or the read action can be selectively performed on the memory cell.

In accordance with the technology of the present invention, the erase action can be performed on a single memory cell (the bit erase operation). Moreover, the erase action can be performed on plural memory cells in a row. The associated operations will be described as follows.

Figure 9A:
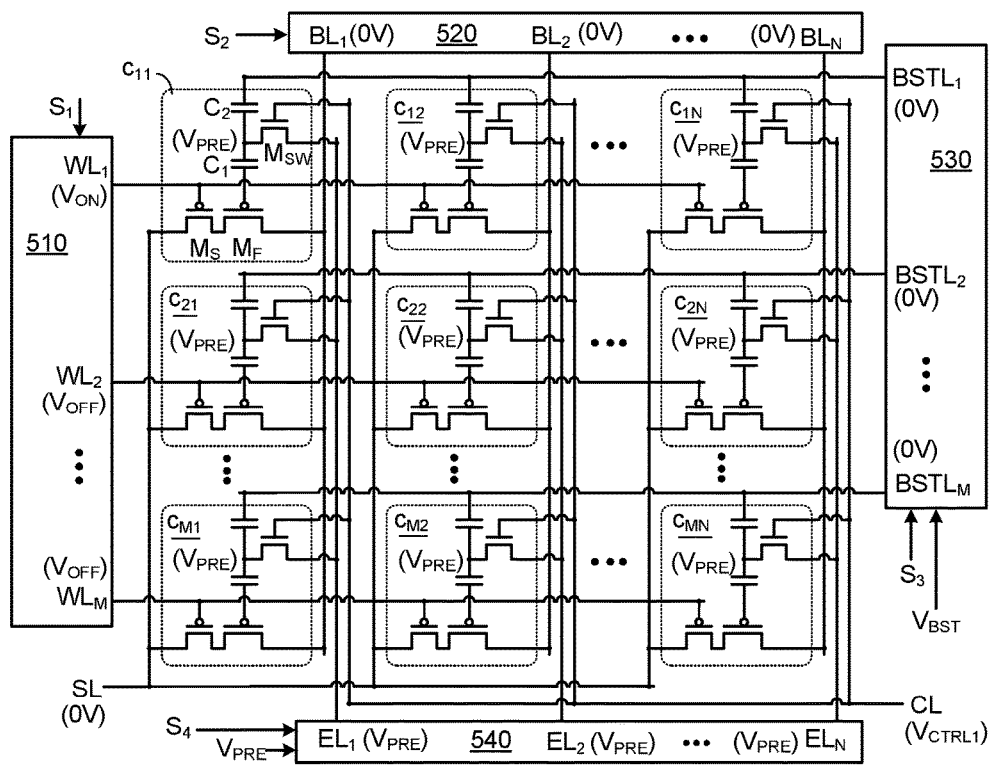
FIG. 9A schematically illustrates the bias voltages for performing the erase action on the memory cells in the selected row of the array structure according to the embodiment of the present invention in the pre-charge phase of the erase cycle.
Figure 9B:
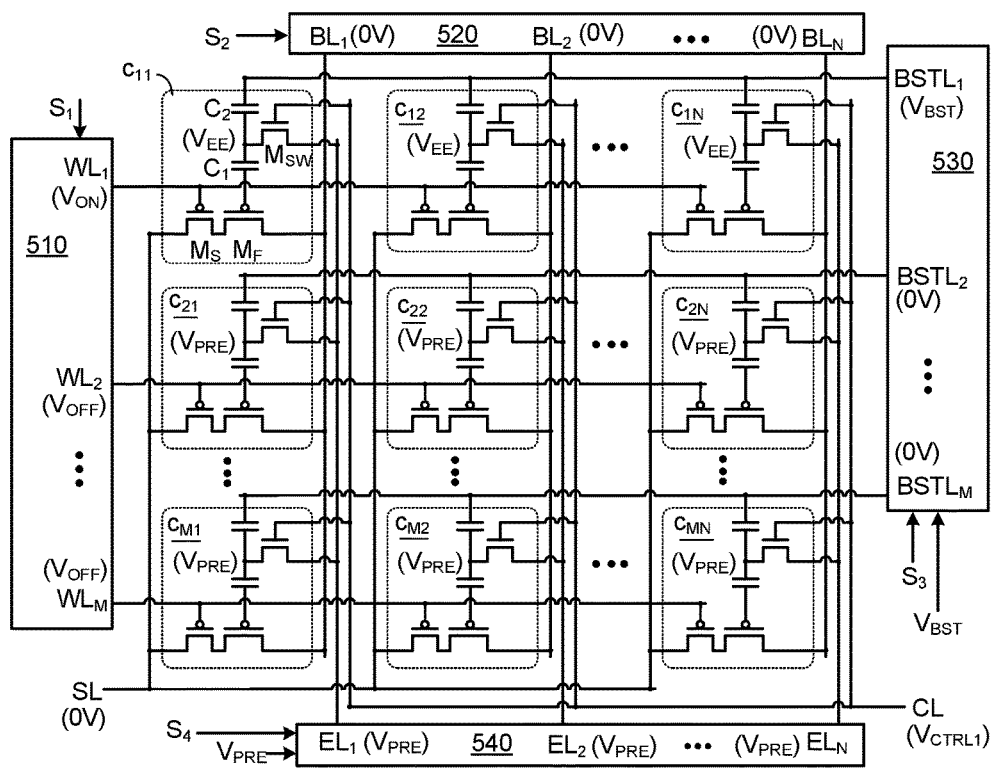
FIG. 9B schematically illustrates the bias voltages for performing the erase action on the memory cells in the selected row of the array structure according to the embodiment of the present invention in the erase phase of the erase cycle.

FIG. 9A schematically illustrates the bias voltages for performing the erase action on the memory cells in the selected row of the array structure according to the embodiment of the present invention in the pre-charge phase of the erase cycle. FIG. 9B schematically illustrates the bias voltages for performing the erase action on the memory cells in the selected row of the array structure according to the embodiment of the present invention in the erase phase of the erase cycle.

Please refer to FIG. 9A. In the pre-charge phase of the erase cycle, the source line SL receives the ground voltage (0V), the bit lines $BL_1$~$BL_N$ receive the ground voltage (0V), the word line $WL_1$ receives the on voltage $V_{ON}$, the word lines $WL_2$~$WL_M$ receive the off voltage $V_{OFF}$, the control line CL receives the control voltage $V_{CTRL1}$, the boost lines $BSTL_1$~$BSTL_M$ receive the ground voltage (0V), and the erase lines $EL_1$~$EL_N$ receive the pre-charge voltage $V_{PRE}$.

As shown in FIG. 9A, all of the switching transistors in the memory cells $C_{11}$~$C_{MN}$ are turned on in the pre-charge phase. Consequently, the voltage at each of the erase nodes of the memory cells $C_{11}$~$C_{MN}$ is equal to the pre-charge voltage $V_{PRE}$.

Please refer to FIG. 9B. In some embodiments, compared with FIGS. 9B and 8B, the erase action can be simultaneously performed on N memory cells $C_{11}$~$C_{1N}$ in the same selected row. In the erase phase of the erase cycle, the source line SL receives the ground voltage (0V), the bit lines $BL_1$~$BL_N$ receive the ground voltage (0V), the word line $WL_1$ receives the on voltage $V_{ON}$, the word lines $WL_2$~$WL_M$ receive the off voltage $V_{OFF}$, the control line CL receives the control voltage $V_{CTRL1}$, the boost line $BSTL_1$ receives the boost voltage $V_{BST}$, the boost lines $BSTL_2$~$BSTL_M$ receive the ground voltage (0V), and the N erase lines $EL_1$~$EL_N$ receive the pre-charge voltage $V_{PRE}$ for performing the erase operation on N memory cells.

As shown in FIG. 9B, the first row is the selected row. Since the boost line $BSTL_1$ receives the boost voltage $V_{BST}$, the voltage at each of the erase nodes in the selected memory cells $C_{11}$~$C_{1N}$ is boosted to the erase voltage $V_{EE}$. That is, $V_{EE}=V_{PRE}+V_{BST}$. Consequently, in each of the memory cells $C_{11}$~$C_{1N}$ in the selected row, hot carriers are ejected from the floating gate to the floating gate transistor $M_F$ to the erase node $E_N$ through the capacitor $C_1$. Consequently, each of the memory cells $C_{11}$~$C_{1N}$ in the selected row is changed to the first storage state.

In the unselected rows, the voltage at the erase node of each memory cell is maintained at the pre-charge voltage $V_{PRE}$. Consequently, hot carriers are not ejected from the floating gates of the floating gate transistor $M_F$ in the memory cells $C_{21}$~$C_{MN}$ of the unselected rows. In other words, the memory cells $C_{21}$~$C_{MN}$ are subjected to the erase inhibition. Consequently, the storage states of the memory cells $C_{21}$~$C_{MN}$ are not changed.

Please refer to FIG. 9B. Of course, in the erase phase of the erase cycle, the boost voltage $V_{BST}$ is transmitted from the boost line driver 530 to the M boost lines BSTL simultaneously. Under this circumstance, all of the memory cells $C_{11}$~$C_{MN}$ in the array structure are subjected to the erase action. Consequently, the storage state of each of the memory cells $C_{11}$~$C_{MN}$ is changed to the first storage state.

From the above descriptions, the present invention provides a memory cell and an array structure of a non-volatile memory. The memory cell has a novel structure. When the erase action is performed on the non-volatile memory, the erase line driver 540 provides the pre-charge voltage $V_{PRE}$, and the boost line driver 530 provides the boost voltage $V_{BST}$. Moreover, the magnitude of the pre-charge voltage $V_{PRE}$ and the magnitude of the boost voltage $V_{BST}$ are lower than the magnitude of the erase voltage $V_{EE}$, and the sum of the pre-charge voltage $V_{PRE}$ and the boost voltage $V_{BST}$ is higher than or equal to the erase voltage $V_{EE}$. Due to the special design of the memory cell, the highest erase voltage $V_{EE}$ will not be transmitted through the switching paths of the erase line driver 540 and the boost line driver 530 during the erase action. In other words, all of the electronic components connected with the erase line driver 540 and the boost line driver 530 will not be subjected to the highest voltage stress. Consequently, these electronic components will not be damaged easily.

It is noted that the voltage values of the program voltage $V_{PP}$, the erase voltage $V_{EE}$, the read voltage $V_R$, the pre-charge voltage $V_{PRE}$, the boost voltage $V_{BST}$, the on voltage $V_{ON}$, the off voltage $V_{OFF}$, the control voltage $V_{CTRL1}$ and the control voltage $V_{CTRL2}$ are not restricted. That is, the voltage values of these bias voltages may be modified while retaining the teachings of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An array structure of a non-volatile memory, the array structure comprising a first memory cell, the first memory cell comprising:
  a first select transistor, wherein a first drain/source terminal of the first select transistor is connected with a source line, and a gate terminal of the first select transistor is connected with a first word line;
  a first floating gate transistor, wherein a first drain/source terminal of the first floating gate transistor is connected with a second drain/source terminal of the first select transistor, and a second drain/source terminal of the first floating gate transistor is connected with a first bit line;
  a first capacitor, wherein a first terminal of the first capacitor is connected with a floating gate of the first floating gate transistor, and a second terminal of the first capacitor is connected with a first erase node;
  a first switching transistor, wherein a first drain/source terminal of the first switching transistor is connected with the first erase node, a second drain/source terminal of the first switching transistor is connected with a first erase line, and a gate terminal of the first switching transistor is connected with a control line; and
  a second capacitor, wherein a first terminal of the second capacitor is connected with the first erase node, and a second terminal of the second capacitor is connected with a first boost line.

2. The array structure as claimed in claim 1, wherein the array structure further comprises a second memory cell, and the second memory cell comprises:
  a second select transistor, wherein a first drain/source terminal of the second select transistor is connected with the source line, and a gate terminal of the second select transistor is connected with a second word line;
  a second floating gate transistor, wherein a first drain/source terminal of the second floating gate transistor is connected with a second drain/source terminal of the second select transistor, and a second drain/source terminal of the second floating gate transistor is connected with the first bit line;
  a third capacitor, wherein a first terminal of the third capacitor is connected with a floating gate of the second floating gate transistor, and a second terminal of the third capacitor is connected with a second erase node;
  a second switching transistor, wherein a first drain/source terminal of the second switching transistor is connected with the second erase node, a second drain/source terminal of the second switching transistor is connected with the first erase line, and a gate terminal of the second switching transistor is connected with the control line; and
  a fourth capacitor, wherein a first terminal of the fourth capacitor is connected with the second erase node, and a second terminal of the fourth capacitor is connected with a second boost line.

3. The array structure as claimed in claim 1, wherein the array structure further comprises a second memory cell, and the second memory cell comprises:
  a second select transistor, wherein a first drain/source terminal of the second select transistor is connected with the source line, and a gate terminal of the second select transistor is connected with the first word line;
  a second floating gate transistor, wherein a first drain/source terminal of the second floating gate transistor is connected with a second drain/source terminal of the second select transistor, and a second drain/source terminal of the second floating gate transistor is connected with a second bit line;
  a third capacitor, wherein a first terminal of the third capacitor is connected with a floating gate of the second floating gate transistor, and a second terminal of the third capacitor is connected with a second erase node;
  a second switching transistor, wherein a first drain/source terminal of the second switching transistor is connected with the second erase node, a second drain/source terminal of the second switching transistor is connected with a second erase line, and a gate terminal of the second switching transistor is connected with the control line; and
  a fourth capacitor, wherein a first terminal of the fourth capacitor is connected with the second erase node, and a second terminal of the fourth capacitor is connected with the first boost line.

4. The array structure as claimed in claim 1, wherein the first select transistor and the first floating gate transistor are p-type transistors, and the first switching transistor is an n-type transistor.

5. The array structure as claimed in claim 1, wherein the first capacitor and the second capacitor are metal-oxide-semiconductor capacitors.

6. The array structure as claimed in claim 1, wherein when a program action is performed, the first word line receives an on voltage, the first erase line receives a program voltage, the first boost line receives a ground voltage, and the first control line receives a first control voltage, the first switching transistor is turned on, the program voltage is transmitted to the first erase node, the first select transistor is turned on, and a program current is generated, wherein when the program current flows through a channel region of the first floating gate transistor, plural hot carriers are injected into the floating gate of the first floating gate transistor from the channel region of the first floating gate transistor, so that a storage state of the first memory cell is changed from a first storage state to a second storage state.

7. The array structure as claimed in claim 6, wherein when the program action is performed, the source line receives the program voltage, the first bit line receives the ground voltage, and the program current flows from the source line to the first bit line.

8. The array structure as claimed in claim 1, wherein when a read action is performed, the first word line receives an on voltage, the source line receives a first read voltage, the first bit line receives a second read voltage lower than the first read voltage, the first erase line receives a third read voltage, the first boost line receives the ground voltage, and the first control line receives a first control voltage.

9. The array structure as claimed in claim 8, wherein when the read action is performed, the first select transistor is turned on, and a read current flows from the source line to the first bit line, wherein if the read current is lower than a reference current, the first memory cell is determined to be in a first storage state, wherein if the read current is higher than the reference current, the first memory cell is determined to be in a second storage state.

10. The array structure as claimed in claim 1, wherein in a pre-charge phase of an erase cycle when an erase action is performed, the first word line receives an on voltage, the source line receives a ground voltage, the first bit line receives the ground voltage, the first erase line receives a pre-charge voltage, the first boost line receives the ground voltage, and the first control line receives a first control voltage.

11. The array structure as claimed in claim 10, wherein in the pre-charge phase of the erase cycle, the first switching transistor is turned on, and the pre-charge voltage is transmitted to the first erase node.

12. The array structure as claimed in claim 11, wherein the erase cycle further includes an erase phase after the pre-charge phase, wherein in the erase phase, the first word line receives the on voltage, the source line receives the ground voltage, the first bit line receives the ground voltage, the first erase line receives the pre-charge voltage, the first boost line receives a first boost voltage, and the first control line receives the first control voltage.

13. The array structure as claimed in claim 12, wherein in the erase phase, a voltage at the first erase node is increased by a voltage increment from the pre-charge voltage, and the voltage increment is equal to the boost voltage, so that the voltage at the first erase node is boosted to an erase voltage, wherein plural hot carriers stored in the first floating gate are ejected from the floating gate of the first floating gate, so that a storage state of the first memory cell is changed from a second storage state to a first storage state.

14. The array structure as claimed in claim 13, wherein the pre-charge voltage is lower than the erase voltage, the boost voltage is lower than the erase voltage, and a sum of the pre-charge voltage and the voltage increment is higher than or equal to the erase voltage.

15. A control method applied to a memory cell of a non-volatile memory, the memory cell comprising: a select transistor including a first drain/source terminal connected with a source line, and a gate terminal connected with a word line; a floating gate transistor including a first drain/source terminal connected with a second drain/source terminal of the select transistor, and a second drain/source terminal connected with a bit line; and a first capacitor including a first terminal connected with a floating gate of the floating gate transistor, and a second terminal connected with an erase node; wherein the control method comprises steps of:
  during a program action, providing an on voltage to the word line, providing a program voltage between the source line and the bit line, and transmitting the program voltage to the erase node;
  during a pre-charge phase of an erase action, providing the on voltage to the word line, providing a ground voltage to the source line and the bit line, and transmitting a pre-charge voltage to the erase node; and
  during an erase phase of the erase action after the pre-charge phase, providing the on voltage to the word line, providing the ground voltage to the source line and the bit line, and boosting a voltage of the erase node from the pre-charge voltage to an erase voltage.

16. The control method as claimed in claim 15, further comprising a step of: during a read action, providing the on voltage to the word line, providing a first read voltage to the source line, providing a second read voltage lower than the first read voltage to the bit line, and transmitting a third read voltage to the erase node.

17. The control method as claimed in claim 15, wherein during the erase phase of the erase action, a boost voltage is coupled to the erase node to boost the voltage of the erase node from the pre-charge voltage to the erase voltage, and a sum of the pre-charge voltage and the boost voltage is higher than or equal to the erase voltage.

18. The control method as claimed in claim 17, wherein the boost voltage is coupled to the erase node through a second capacitor.

19. The control method as claimed in claim 15, wherein the program voltage is transmitted to the erase node through a switching transistor during the program action; and the pre-charge voltage is transmitted to the erase node through the switching transistor during the pre-charge phase of the erase action.

* * * * *